(12) United States Patent
Hutton et al.

(10) Patent No.: US 8,307,534 B2
(45) Date of Patent: Nov. 13, 2012

(54) METHOD OF FORMING A COUPLED COIL ARRANGEMENT

(75) Inventors: Graham Hutton, Oxford (GB);
M'Hamed Lakrimi, Marston (GB);
Adrian Mark Thomas, Bicester (GB)

(73) Assignee: Siemens Plc, Frimley, Camberley, Surrey (GB)

( * ) Notice: Subject to any disclaimer, the term of this patent is extended or adjusted under 35 U.S.C. 154(b) by 0 days.

(21) Appl. No.: 13/360,872

(22) Filed: Jan. 30, 2012

(65) Prior Publication Data

US 2012/0124823 A1 May 24, 2012

Related U.S. Application Data

(62) Division of application No. 12/388,154, filed on Feb. 18, 2009, now Pat. No. 8,136,222.

(30) Foreign Application Priority Data

Apr. 9, 2008 (GB) .................................. 0806414.9

(51) Int. Cl.
*H01L 39/24* (2006.01)

(52) U.S. Cl. ............. 29/599; 29/602.1; 29/604; 29/605; 29/606; 29/840; 324/300; 324/309; 324/318; 336/110; 336/175; 336/178; 336/184; 363/17; 363/48; 363/58

(58) Field of Classification Search .................... 29/599, 29/602.1, 604–607, 840; 324/300, 309, 318–322; 336/110, 175, 178, 184, 214, 215, 234; 363/17, 363/48, 58
See application file for complete search history.

(56) References Cited

U.S. PATENT DOCUMENTS

| 3,703,664 A | 11/1972 | Cronin |
| 5,278,533 A * | 1/1994 | Kawaguchi .................... 335/213 |
| 5,461,773 A * | 10/1995 | Kawaguchi .................... 29/605 |
| 2008/0303125 A1 | 12/2008 | Chen et al. |

FOREIGN PATENT DOCUMENTS

| GB | 1006396 | 9/1965 |
| GB | 1094490 | 12/1967 |
| JP | 58194266 A | 11/1983 |
| JP | 2007-81244 A | 3/2007 |

OTHER PUBLICATIONS

British Search Report dated Aug. 8, 2008 (One (1) page).
British Examination Report under Section 18(3) dated Dec. 11, 2008 (One (1) page).
British Combined Search and Examination Report under Sections 17 & 18(3) dated Aug. 11, 2008 (Three (3) pages).

* cited by examiner

*Primary Examiner* — Paul D Kim
(74) *Attorney, Agent, or Firm* — Crowell & Moring LLP

(57) ABSTRACT

A method of forming an encapsulated coupled coil arrangement. The method includes coupling a first lead of a first coil to a second lead of an electrical circuit device, by soldering or infusion, using a superconductive jointing alloy; and encapsulating the first coil, the electrical circuit device and the jointed leads of the first coil and the electrical circuit device in an encapsulation material. The jointing alloy has a melting point higher than a highest temperature experienced by the encapsulation material having the encapsulation process.

13 Claims, 1 Drawing Sheet

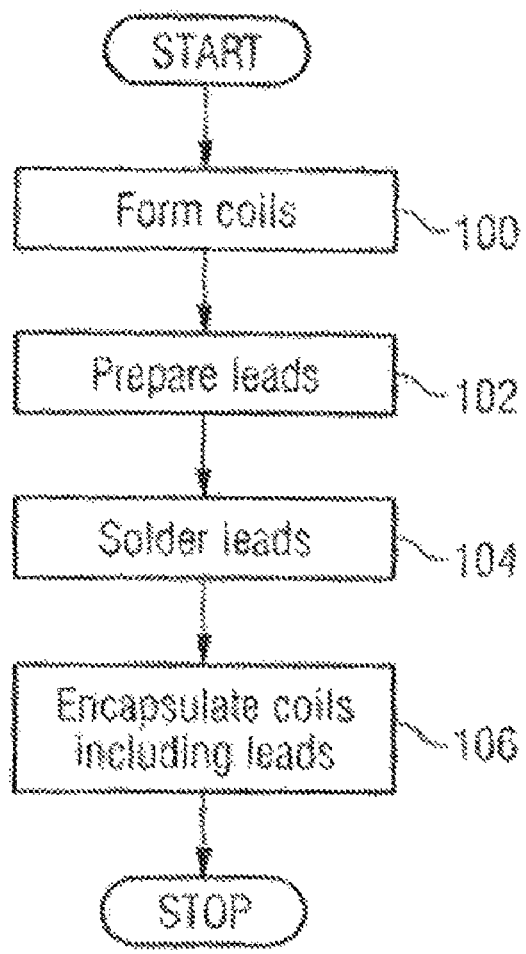
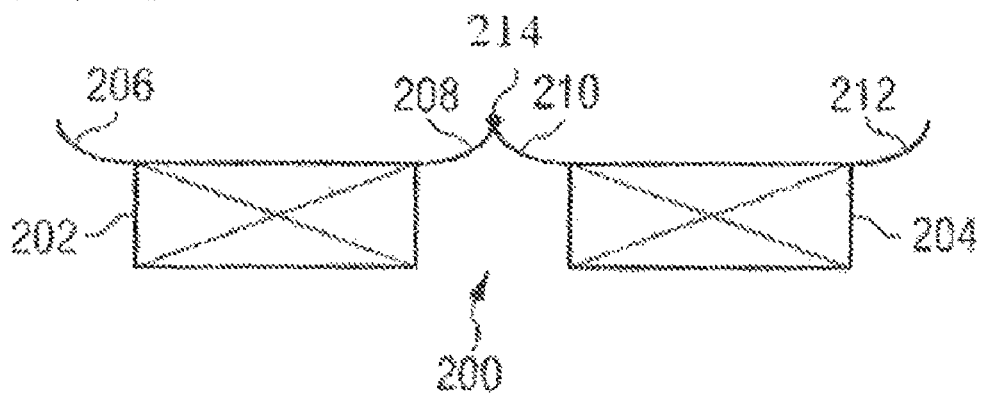

METHOD OF FORMING A COUPLED COIL ARRANGEMENT

This is a division of application Ser. No. 12/388,154 filed Feb. 18, 2009, now U.S. Pat. No. 8,136,222.

BACKGROUND AND SUMMARY OF THE INVENTION

The present invention relates to a method of forming a coupled coil arrangement of the type that, for example, is used on a superconducting coil in a superconducting magnet. The present invention also relates to a superconducting solder of the type that, for example, is used to couple a lead of a first coil to a lead of a second coil and also to couple a lead from a section of one coil to a lead of another section within the same coil.

In the field of Magnetic Resonance Imaging (MRI), it is known to provide a superconducting magnet in order to generate a strong uniform static magnetic field, known as a $B_0$ field, in order to polarise nuclear spins in an object under test.

The superconductive magnet typically comprises a coil support structure carrying windings of a superconducting wire formed from an alloy that exhibits the property of superconduction at very low temperatures. In this respect, a number of coils are formed about the coil support structure and it is necessary to connect the coils in series. Each coil has a respective pair of leads, the leads being used, inter alia, to couple the coils in series. For some superconductive magnet designs, one or more of the coils can comprise a number of coil sections joined together in series to form a given coil.

Prior to series connection of the coil sections and/or coils, the coils are encapsulated in resin to prevent movement of the windings. However, after encapsulation of the coils in resin, the leads need to be cleaned in order to remove residual resin from the leads. This cleaning process can result in the leads becoming damaged, thereby causing whole coils or coil sections to become waste. It is therefore desirable to connect the leads and hence coils prior to encapsulation of the coil sections and/or coils in resin. In this respect, a common process used to joint coil sections and/or coils employs a superconductive alloy known as "Wood's metal" to joint two leads from respective coils or coil sections as part of the series coupling. However, due to the relatively low melting point of the Wood's metal, the resin encapsulation process will cause any solder joints formed using the Wood's metal to melt, thereby reducing the integrity of the solder joints. Consequently, soldering of joints takes place after the encapsulation stage and the leads are not encapsulated in the resin. Instead, the encapsulated leads are restrained to avoid movement thereof during operation of the superconducting magnet comprising the coils. Additionally, the Wood's metal contains cadmium, which is environmentally hazardous and so requires special precautions during use to protect the health of those using the Wood's metal.

According to a first aspect of the present invention, there is provided a method of forming an encapsulated coupled coil arrangement. The method comprises: coupling a first lead of a first coil to a second lead of an electrical circuit device, by soldering or infusion, using a superconductive jointing alloy; and encapsulating the first coil, the electrical circuit device and the jointed leads of the first coil and the electrical circuit device in an encapsulation material. The jointing alloy has a melting point higher than a highest temperature experienced by the encapsulation material during the encapsulation process.

For the avoidance of doubt, references herein to coils, coil sections and switches are examples of electrical circuit devices.

The coupling of the first lead of the first coil and the second lead of the electrical circuit device may result in the first coil and electrical circuit device being series coupled.

The superconductive jointing alloy may be a superconductor at low temperatures. The superconductive jointing alloy may have a superconducting transition temperature below about 10 Kelvin. The superconducting transition temperature may be below about 9.2 Kelvin. The superconducting transition temperature may be below about 5 Kelvin, for example about 4.2 K.

The electrical circuit device may be a second coil.

The electrical circuit device may be a cryogenic switch.

The superconductive jointing alloy may comprise: from 40 to 56 wt. % bismuth, and from 44 to 60 wt. % lead, and a balance of unavoidable impurities.

The superconductive jointing alloy may comprise: from 30 to 55 wt. % bismuth, from 30 to 50 wt. % lead, and from 15 to 30 wt. % tin, and a balance of unavoidable impurities.

The superconductive jointing alloy may comprise from 35 to 45 wt. % bismuth. The superconductive jointing alloy may comprise from 35 to 45 wt. % lead. The superconductive jointing alloy may comprise from 17 to 20 wt. % tin.

The superconductive jointing alloy may comprise approximately 55.5 wt. % Bi and approximately 44.5 wt. % Pb.

The superconductive jointing alloy may comprise approximately 52.5 wt. % Bi, approximately 32 wt. % Pb and approximately 15.5 wt. % Sn.

The superconductive alloy may be in the form of a bar, a stick, a powder, a solid or cored wire, a foil, a preform or a paste.

The superconductive alloy may have a melting point above about 90° C.

The superconductive alloy may have a melting point of about 95° C. The superconductive alloy may have a melting point above about 96° C.

The superconductive alloy may have a melting point below about 137° C.

The encapsulation material may be a thermoset material. The thermoset material may be a resin.

The encapsulation material may be a thermoplastic material. The thermoplastic material may be wax or polyester.

According to a second aspect of the present invention, there is provided a method of forming a superconductive magnet for tomography, the method comprising the method of forming a coupled coil arrangement as set forth above in relation to the first aspect of the invention.

It is thus possible to provide a method of coupling a lead of a first coil to a lead of a second coil that enables the coils including the coupled leads to be encapsulated without damage to a solder joint coupling the leads. Consequently, the leads do not have to undergo a cleaning stage and do not have to be restrained so as to avoid movement of the leads in an active electromagnetic field. The use of the superconductive jointing alloy is advantageously compatible with existing manufacturing processes for the production of the superconducting magnet and obviates the use of Cadmium.

BRIEF DESCRIPTION OF THE DRAWING FIGURES

At least one embodiment of the invention will now be described, by way of example only, with reference to the accompanying drawings, in which:

FIG. 1 is a flow diagram of a method of forming a coupled coil arrangement constituting an embodiment of the invention; and FIG. 2 is a schematic diagram of a pair of coupled coils formed by the method of FIG. 1.

DETAILED DESCRIPTION

Throughout the following description identical reference numerals will be used to identify like parts.

Referring to FIGS. 1 and 2, a superconductive magnet coil 200 is formed from a first constituent coil 202 and a second constituent coil 204 (Step 100) using any suitable alloy capable of exhibiting the property of superconduction, for example, at very low temperatures. In this example, a wire formed from a Niobium-Titanium alloy is embedded in a copper or copper-nickel matrix and wound into coils according to any suitable technique known in the art. The first coil 202 comprises a first lead 206 and a second lead 208 and the second coil 204 comprises a third lead 210 and a fourth lead 212. In order to form the superconductive magnet coil 200, the first coil 202 is coupled to the second coil 204 in series.

Consequently, in this example, the second lead 208 of the first coil 202 needs to be coupled to the third lead 210 of the second coil 204. The second lead 208 and the third lead 210 are therefore prepared (Step 102) using any suitable technique known to the skilled person, for example by conventional etching of portions of the second and third leads 208, 210 using nitric acid, followed by a hydrofluoric acid etch, in order to prepare a persistent joint. After the hydrofluoric acid etch, the etched wires are rinsed in water. Thereafter, the portions to be joined are plaited and tinned with indium.

Once prepared (Step 102), the portions of the second and third leads 208, 210 are soldered (Step 104) together using a solder alloy at a temperature above about 125° C. to form a superconductive joint 214; the composition of the superconductive alloy is described hereinbelow.

The solder alloy was formed by melting Bismuth (Bi)—55.5 wt. % in a cast iron crucible or a ceramic crucible. Then, lead (Pb)—44.5 wt. % was added to the molten Bismuth at an alloy bath melting temperature, for example about 125° C.

The relative proportions of the two metals can also be as follows.

| Metal | Relative Proportions |
|---|---|
| Bismuth | 40-56 wt. % |
| Lead | 44-60 wt. % |

The temperature can be in the range of between about 124° C. and 126° C.

The above alloy was cast into an ingot and later remelted when soldering the second and third leads 208, 210 together. The superconductive alloy can be formed as a bar, a stick, a powder, a solid or cored wire, a foil, a preform or a paste.

An alternative alloy was formed by melting Bismuth (Bi)—52.5 wt. % in a cast iron crucible or a ceramic crucible. Then, lead (Pb)—32 wt. % and Tin (Sn)—15.5 wt. % were added to the molten Bismuth at an alloy bath melting temperature, for example 96° C.

The relative proportions of the three metals can also be as follows.

| Metal | Relative Proportions |
|---|---|
| Bismuth | 30-55 wt. % |
| Lead | 30-50 wt. % |
| Tin | 15-30 wt. % |

The temperature can be in the range of between about 96° C. and 137° C.

The above alloy was cast into an ingot and later remelted when soldering the second and third leads 208, 210 together. The superconductive alloy can be formed as a bar, a stick, a powder, a solid or cored wire, a foil, a preform or a paste.

Although the above compositions have been described without mention of impurities, the skilled person should appreciate that the alloy may contain unavoidable impurities, but these are unlikely to exceed 1 wt. %.

The solder alloys produced in the above embodiments have a respective melting point greater than 95° C., for example between about 96° C. and about 137° C.; this is a typical temperature range for curing thermoset materials. It should therefore be understood that the joint formed withstands the temperatures of curing thermoset materials so that the integrity of the joint is not impaired by heating of the joint during thermoset curing.

The performance of the joint has been tested and joints have been found to be persistent, i.e. the joints when operational each have such a low electrical resistance that current flowing through the joint suffers very little decay, for example less than 0.1 ppm/hr. Such a degree of persistence translates into the joint having a resistance of less than $10^{-12}\Omega$. Indeed, currents flowing though joints formed from the above alloys have been found not to degrade after a thermoset curing cycle, even at electrical currents and background fields far in excess of electrical currents and background fields required of a tomography system, for example an MRI system.

Although the above examples have been described in the context of jointing coils to form a superconductive magnet, the skilled person should appreciate that an individual coil can be formed from coil sections and so a superconductive magnet can be formed from a number of coils, each formed from a number of serially coupled coil portions. However, for the sake of interpretation, reference herein to jointing coils should be understood to embrace jointing of coil portions to form a given coil. Furthermore, it should also be understood that the above examples are not limited to coupling of coils or coil sections to other coils or coil sections but coupling of a coil or coil section to other electrical circuit devices is contemplated, for example a cryogenic switch.

In this respect, once the second and third leads 208, 210 have been soldered (Step 104) together, the cryogenic switch formed from so-called "switch wire" is connected, in this example, between the first and fourth leads 206, 212. The switch wire is formed from the Nb—Ti alloy wire mentioned above or any other suitable superconductive alloy, the Nb—Ti alloy wire being embedded in a copper or copper-nickel alloy matrix. Prior to connection of the cryogenic switch in place between the first and fourth leads 206, 212, the first and fourth leads 206, 212 and the leads of the cryogenic switch are prepared in the same manner as that described above in relation to the second and third leads 208, 210 using any suitable technique known to the skilled person. For example, portions of the first and fourth leads 206, 212 and the leads of the cryogenic switch are etched in a conventional manner using nitric acid, followed by a hydrofluoric acid etch in order to prepare a persistent joint. After the hydrofluoric acid etch, the etched wires are rinsed in water. Thereafter, the portions to be jointed are plaited and tinned with indium. The first and second coils 202, 204, the cryogenic switch and associated leads and the first, second, third and fourth leads 206, 208, 210, 212 are encapsulated (Step 106) in any suitable encapsulation material, for example a thermoset material, such as resin, or a thermoplastic material, such as wax or polyester.

The BiPb alloy and the BiPbSn alloys are eutectic, but have a sufficiently high melting point to avoid melting in the presence of the encapsulation material when heated for the encapsulation stage (Step 106), for example more than about 90° C., such as about 95° C. or more than about 120° C., such as about 124° C. or about 125° C.

Although the above examples have been described in the context of jointing leads formed from an Nb—Ti alloy, the skilled person should appreciate that the superconductive jointing alloy is suitable for jointing leads formed from other superconductive alloys, for example a Niobium-Tin ($Nb_3Sn$) alloy.

In another embodiment, the above-described alloys can be used as part of an etched and infused jointing process in order to form a hybrid joint between two different types of superconductive material, for example a Niobium-Tin ($Nb_3Sn$) tape and an Nb—Ti wire. In this example, the $Nb_3Sn$ tape comprises a thin layer of $Nb_3Sn$ sandwiched between two layers of copper foil. The Nb—Ti wire is embedded in a copper matrix, although a Ni—Cu matrix can be used. In order to prepare end portions of the two different superconductive materials before forming a superconductive joint, the copper foil of an end portion of the tape and the copper matrix of an end portion of the wire are initially removed using tin at a temperature of about 300° C. The joint is then formed by infusion with one of the above-described alloys at a temperature of between about 300° C. and about 400° C. Thereafter, the joint formed is encapsulated (Step 106) in any suitable encapsulation material, for example a thermoset material, such as resin, or a thermoplastic material, such as wax or polyester.

Whilst, in the above example, Niobium-Tin tape is employed, the skilled person should appreciate that the Niobium-Tin superconductive alloy employed can be formed as wire and used for coupling thereto. Furthermore, the skilled person should also appreciate that whilst the above example describes hybrid jointing of Niobium-Tin tape to Niobium-Titanium wire, the above technique can be employed to joint Niobium-Titanium wire to Niobium-Titanium wire.

Although the above examples have been described in the context of series coupling of coils or coil sections to other electrical circuit devices, the skilled person should appreciate that the jointing process can be employed to achieve parallel coupling of a coil or coil section to an electrical circuit device.

The invention claimed is:

1. A method of forming an encapsulated coupled coil arrangement, the method comprising:
    coupling a first lead of a first coil to a second lead of an electrical circuit device, by soldering or infusion, using a superconductive jointing alloy; and
    encapsulating the first coil, the electrical circuit device and the jointed leads of the first coil and the electrical circuit device in an encapsulation material, the jointing alloy having a melting point higher than a highest temperature experienced by the encapsulation material during the encapsulation process, wherein the encapsulation material is a thermoplastic material.

2. The method as claimed in claim 1, wherein the superconductive jointing alloy has a superconducting transition temperature below about 10 Kelvin.

3. The method as claimed in claim 2, wherein the superconducting transition temperature is below about 9.2 Kelvin.

4. The method as claimed in claim 3, wherein the superconducting transition temperature is below about 5 Kelvin.

5. The method as claimed in claim 1, wherein the electrical circuit device is a second coil.

6. The method as claimed in claim 1, wherein the electrical circuit device is a cryogenic switch.

7. The method as claimed in claim 1, wherein the superconductive jointing alloy comprises:
    from 40 to 56 wt. % bismuth;
    from 44 to 60 wt. % lead;
    and a balance of unavoidable impurities.

8. The method as claimed in claim 7, wherein the superconductive jointing alloy comprises approximately 55.5 wt. % Bi and approximately 44.5 wt. % Pb.

9. The method as claimed in claim 1, wherein the superconductive jointing alloy comprises:
    from 30 to 55 wt. % bismuth;
    from 30 to 50 wt. % lead;
    from 15 to 30 wt. % tin;
    and a balance of unavoidable impurities.

10. The method as claimed in claim 9, the superconductive jointing alloy comprises approximately 52.5 wt. % Bi, approximately 32 wt. % Pb and approximately 15.5 wt. % Sn.

11. The method as claimed in claim 1, wherein the superconductive alloy is in the form of a bar, a stick, a powder, a solid or cored wire, a foil, a preform or a paste.

12. The method as claimed in claim 1, wherein the superconductive alloy has a melting point above about 90° C.

13. A method of forming a superconductive magnet for tomography, the method comprising the method of forming an encapsulated coupled coil arrangement as claimed in claim 1.

* * * * *